United States Patent
Lee et al.

(10) Patent No.: US 10,985,196 B2
(45) Date of Patent: Apr. 20, 2021

(54) THIN FILM TRANSISTOR SUBSTRATE WITH INTERMEDIATE INSULATING LAYER AND DISPLAY USING THE SAME

(71) Applicant: LG Display Co., Ltd., Seoul (KR)

(72) Inventors: Youngjang Lee, Seoul (KR); Kyungmo Son, Gyeonggi-do (KR); Sohyung Lee, Gyeonggi-do (KR); Hoyoung Jung, Gyeonggi-do (KR); Moonho Park, Seoul (KR); Sungjin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 117 days.

(21) Appl. No.: 14/628,444

(22) Filed: Feb. 23, 2015

(65) Prior Publication Data

US 2015/0243687 A1    Aug. 27, 2015

Related U.S. Application Data

(60) Provisional application No. 61/943,628, filed on Feb. 24, 2014.

(51) Int. Cl.
   *H01L 27/12*    (2006.01)
   *H01L 29/786*    (2006.01)
   (Continued)

(52) U.S. Cl.
   CPC ...... *H01L 27/1251* (2013.01); *H01L 27/1225* (2013.01); *H01L 27/1248* (2013.01);
   (Continued)

(58) Field of Classification Search
   CPC ............ H01L 27/1251; H01L 27/1225; H01L 27/1214; H01L 29/7869
   See application file for complete search history.

(56) References Cited

U.S. PATENT DOCUMENTS 6,128,060 A    10/2000  Shimada et al.
6,261,881 B1   7/2001   Yamazaki et al.
(Continued)

FOREIGN PATENT DOCUMENTS

JP    2007-123861 A    5/2007
JP    2007-286150 A    11/2007
(Continued)

OTHER PUBLICATIONS

Office Action dated Jul. 8, 2015, issued by the U.S. Patent & Trademark Office in U.S. Appl. No. 14/628,357.
(Continued)

*Primary Examiner* — David Chen
(74) *Attorney, Agent, or Firm* — Morgan, Lewis & Bockius LLP

(57) ABSTRACT

Provided are a thin film transistor substrate and a display using the same. A thin film transistor substrate includes: a substrate, a first thin film transistor disposed on the substrate, the first thin film transistor including: a polycrystalline semiconductor layer, a first gate electrode on the polycrystalline semiconductor layer, a first source electrode, and a first drain electrode, a second thin film transistor disposed on the substrate, the second thin film transistor including: a second gate electrode, an oxide semiconductor layer on the second gate electrode, a second source electrode, and a second drain electrode, an intermediate insulating layer including a nitride layer and an oxide layer on the nitride layer, the intermediate insulating layer being disposed on the first gate electrode and the second gate electrode and under the oxide semiconductor layer, and an etch-stopper layer disposed on the oxide semiconductor layer.

8 Claims, 9 Drawing Sheets

(51) Int. Cl.
  *H01L 27/32*     (2006.01)
  *H01L 29/04*     (2006.01)

(52) U.S. Cl.
  CPC .......... *H01L 27/3244* (2013.01); *H01L 29/04* (2013.01); *H01L 29/7869* (2013.01); *H01L 29/78675* (2013.01)

(56) References Cited

U.S. PATENT DOCUMENTS

| | | | |
|---|---|---|---|
| 6,265,730 | B1 | 7/2001 | Nakanishi et al. |
| 7,358,528 | B2 | 4/2008 | Kim et al. |
| 7,915,723 | B2 | 3/2011 | Sasaki et al. |
| 8,242,496 | B2 | 8/2012 | Yamazaki et al. |
| 8,405,161 | B2 | 3/2013 | Park et al. |
| 8,582,349 | B2 | 11/2013 | Yamazaki et al. |
| 8,659,092 | B2 | 2/2014 | Chen et al. |
| 8,728,838 | B2 | 5/2014 | Takahara |
| 8,759,832 | B2 | 6/2014 | Yang et al. |
| 8,835,913 | B2 | 9/2014 | Yeh et al. |
| 8,866,233 | B2 | 10/2014 | Yamazaki |
| 8,890,781 | B2 | 11/2014 | Yamazaki et al. |
| 9,129,927 | B2 | 9/2015 | Gupta et al. |
| 2002/0011597 | A1 | 1/2002 | Fujimoto et al. |
| 2002/0014628 | A1 | 2/2002 | Koyama |
| 2003/0047785 | A1* | 3/2003 | Kawasaki ......... H01L 29/66969 257/350 |
| 2004/0016924 | A1 | 1/2004 | Yamada et al. |
| 2004/0075783 | A1 | 4/2004 | Lee |
| 2005/0036382 | A1 | 2/2005 | Kato |
| 2005/0176194 | A1 | 8/2005 | Sasaki et al. |
| 2006/0246360 | A1* | 11/2006 | Hwang ............... H01L 27/1214 430/5 |
| 2006/0246644 | A1 | 11/2006 | Isobe et al. |
| 2007/0096100 | A1 | 5/2007 | Lee et al. |
| 2007/0108472 | A1 | 5/2007 | Jeong et al. |
| 2008/0116457 | A1 | 5/2008 | Park et al. |
| 2008/0179598 | A1 | 7/2008 | Kim et al. |
| 2009/0002590 | A1 | 1/2009 | Kimura |
| 2009/0160741 | A1 | 6/2009 | Inoue et al. |
| 2009/0321725 | A1 | 12/2009 | Yoshida et al. |
| 2010/0102313 | A1 | 4/2010 | Miyairi et al. |
| 2010/0163868 | A1 | 7/2010 | Yamazaki et al. |
| 2010/0171120 | A1 | 7/2010 | Gosain et al. |
| 2010/0182223 | A1 | 7/2010 | Choi et al. |
| 2010/0193785 | A1 | 8/2010 | Kimura |
| 2010/0276604 | A1 | 11/2010 | Okada |
| 2011/0012105 | A1* | 1/2011 | Yamazaki ........... H01L 27/1251 257/43 |
| 2011/0049507 | A1 | 3/2011 | Choi |
| 2011/0049523 | A1 | 3/2011 | Choi et al. |
| 2011/0089417 | A1 | 4/2011 | Yamazaki et al. |
| 2011/0090207 | A1 | 4/2011 | Yamazaki et al. |
| 2011/0101332 | A1 | 5/2011 | Yamazaki et al. |
| 2011/0101333 | A1 | 5/2011 | Shionoiri et al. |
| 2011/0115839 | A1 | 5/2011 | Takahashi et al. |
| 2011/0156024 | A1 | 6/2011 | Koyama et al. |
| 2011/0278564 | A1* | 11/2011 | Yoneda ............... H01L 21/8258 257/43 |
| 2011/0298508 | A1* | 12/2011 | Wu ....................... H03L 7/0814 327/157 |
| 2012/0025320 | A1 | 2/2012 | Chen |
| 2012/0061665 | A1* | 3/2012 | Miyake ............... H01L 27/1225 257/43 |
| 2012/0085998 | A1 | 4/2012 | Kwon et al. |
| 2012/0132791 | A1* | 5/2012 | Aoki ........................ G01J 1/44 250/214.1 |
| 2012/0217515 | A1 | 8/2012 | Yamazaki et al. |
| 2012/0273773 | A1 | 11/2012 | Ieda et al. |
| 2013/0015448 | A1 | 1/2013 | Yang et al. |
| 2013/0069058 | A1 | 3/2013 | Yamazaki et al. |
| 2013/0092927 | A1 | 4/2013 | Murai et al. |
| 2013/0168666 | A1 | 7/2013 | Yan et al. |
| 2013/0215370 | A1 | 8/2013 | Takanishi et al. |
| 2013/0270550 | A1* | 10/2013 | Okazaki ............. H01L 27/1225 257/43 |
| 2014/0035478 | A1 | 2/2014 | Kitakado et al. |
| 2014/0087525 | A1 | 3/2014 | Chen et al. |
| 2014/0131703 | A1 | 5/2014 | Miyamoto et al. |
| 2014/0159038 | A1 | 6/2014 | Im |
| 2014/0246672 | A1 | 9/2014 | Yamazaki |
| 2015/0054799 | A1 | 2/2015 | Chang et al. |
| 2015/0055047 | A1 | 2/2015 | Chang et al. |
| 2015/0055051 | A1 | 2/2015 | Osawa et al. |
| 2015/0076467 | A1* | 3/2015 | Sasaki ............... H01L 21/31111 257/40 |
| 2015/0236079 | A1 | 8/2015 | Choi |

FOREIGN PATENT DOCUMENTS

| | | |
|---|---|---|
| JP | 2009-033145 A | 2/2009 |
| JP | 2009-075385 A | 4/2009 |
| JP | 2009-093154 A | 4/2009 |
| JP | 2010-161382 A | 7/2010 |
| JP | 2011-048339 A | 3/2011 |
| JP | 2011-054936 A | 3/2011 |
| JP | 2011-109079 A | 6/2011 |
| JP | 2011-119671 A | 6/2011 |
| JP | 2011-119672 A | 6/2011 |
| JP | 2011-141524 A | 7/2011 |
| JP | 2011-141529 A | 7/2011 |
| JP | 2011-166130 A | 8/2011 |
| JP | 2013-008946 A | 1/2013 |
| JP | 2013-054357 A | 3/2013 |
| JP | 2013-058770 A | 3/2013 |
| JP | 2013-092783 A | 5/2013 |
| JP | 2013-127616 A | 6/2013 |
| JP | 2013-243397 A | 12/2013 |
| KR | 2008-0046508 A | 5/2008 |
| KR | 2008-0073944 A | 8/2008 |
| KR | 2009-0004944 A | 1/2009 |
| KR | 2009-0080932 A | 7/2009 |
| KR | 10-2010-0086256 A | 7/2010 |
| KR | 2011-0021259 A | 3/2011 |
| KR | 2011-0024935 A | 3/2011 |
| KR | 2011-0065556 A | 6/2011 |
| KR | 2011-0069759 A | 6/2011 |
| KR | 2011-0069760 A | 6/2011 |
| KR | 2011-0111542 A | 10/2011 |
| KR | 10-2011-0126071 A | 11/2011 |
| KR | 10-2012-0037838 A | 4/2012 |
| KR | 2012-0079830 A | 7/2012 |
| KR | 2012-0091239 A | 8/2012 |
| KR | 2012-0096463 A | 8/2012 |
| KR | 2012-0096469 A | 8/2012 |
| KR | 2012-0101997 A | 9/2012 |
| KR | 2012-0103566 A | 9/2012 |
| KR | 2012-0103627 A | 9/2012 |
| KR | 2012-0122912 A | 11/2012 |
| KR | 2012-0125272 A | 11/2012 |
| KR | 2013-0012069 A | 1/2013 |
| KR | 2014-0036335 A | 3/2014 |
| WO | 2011/125353 A1 | 10/2011 |

OTHER PUBLICATIONS

U.S. Appl. No. 14/629,632, filed Feb. 24, 2015.
U.S. Appl. No. 14/629,538, filed Feb. 24, 2015.
U.S. Appl. No. 14/628,378, filed Feb. 23, 2015.
U.S. Appl. No. 14/629,544, filed Feb. 24, 2015.
U.S. Appl. No. 14/628,411, filed Feb. 23, 2015.
U.S. Appl. No. 14/628,357, filed Feb. 23, 2015.
U.S. Appl. No. 14/629,554, filed Feb. 24, 2015.
Office Action dated Apr. 16, 2015 in related technology U.S. Appl. No. 14/628,411.
Office Action dated Nov. 4, 2015, issued by the United States Patent and Trademark Office in U.S. Appl. No. 14/628,357.
Office Action dated Nov. 6, 2015, issued by the United States Patent and Trademark Office in U.S. Appl. No. 14/628,378.
Office Action dated Nov. 10, 2015, issued by the United States Patent and Trademark Office in U.S. Appl. No. 14/629,632.

(56) References Cited

OTHER PUBLICATIONS

Office Action issued in U.S. Appl. No. 14/629,632 dated Apr. 13, 2016.
Office Action issued in U.S. Appl. No. 14/629,554 dated Feb. 23, 2016.
Office Action issued in U.S. Appl. No. 14/628,378 dated Mar. 29, 2016.
Office Action issued in U.S. Appl. No. 14/629,544 dated May 12, 2016.
Office Action issued in Korean Patent Application No. 10-2015-0025968 dated May 30, 2016.
Office Action issued in U.S. Appl. No. 14/629,544 dated Oct. 28, 2016.
Office Action issued in U.S. Appl. No. 14/628,357 dated Oct. 28, 2016.
Office Action issued in U.S. Appl. No. 14/628,378 dated Oct. 7, 2016.
Office Action issued in U.S. Appl. No. 14/629,538 dated Oct. 27, 2016.
Office Action issued in U.S. Appl. No. 14/628,357 dated May 31, 2016.
Hong Xiao, "Introduction to Semiconductor Manufacturing Technology," Society of Photo-Optical Instrumentation Engineers (SPIE), Second Edition, 2012, pp. 125, 164-166, 369, and 413-414.
Office Action issued in U.S. Appl. No. 14/628,378 dated Apr. 14, 2016.
Office Action issued in U.S. Appl. No. 14/629,544 dated Feb. 27, 2017.
Office Action issued in U.S. Appl. No. 14/629,538 dated Feb. 2, 2018.

* cited by examiner

THIN FILM TRANSISTOR SUBSTRATE WITH INTERMEDIATE INSULATING LAYER AND DISPLAY USING THE SAME

CROSS-REFERENCE TO RELATED APPLICATION(S)

This application claims the benefit of U.S. Provisional Application No. 61/943,628, filed on Feb. 24, 2014, the entire disclosure of which is hereby incorporated by reference herein for all purposes.

BACKGROUND

1. Technical Field

The present disclosure relates to a thin film transistor substrate having two different types of thin film transistors on the same substrate, and a display using the same.

2. Discussion of the Related Art

Nowadays, as the information society is developed, the requirements of displays for representing information are increasing. Accordingly, various flat panel displays (FPDs) are developed for overcoming many drawbacks of the cathode ray tube (CRT) such as heavy weight and bulk volume. Flat panel display devices include a liquid crystal display device (LCD), a plasma display panel (PDP), a organic light emitting display device (OLED), and a electrophoresis display device (ED).

The display panel of a flat panel display may include a thin film transistor substrate having a thin film transistor allocated in each pixel region arrayed in a matrix manner. For example, the liquid crystal display device (LCD) represents video data by controlling the light transitivity of the liquid crystal layer using electric fields. The organic light emitting diode display represents video data by generating properly controlled light at each pixel disposed in a matrix manner using an organic light emitting diode formed in each pixel.

As a self-emitting display device, the organic light emitting diode display device has merits including very fast response speed, high brightness, and large viewing angle. The organic light emitting diode display (OLED) using the organic light emitting diode having good energy efficiency can be categorized in the passive matrix type organic light emitting diode display (PMOLED) and the active matrix type organic light emitting diode display (AMOLED).

As personal appliances have been more adopted, portable and/or wearable devices have been actively developed. To apply the display device for a portable and/or wearable device, the device should have low power consumption. However, using already developed technologies, a limitation has been getting a display with low power consumption.

SUMMARY

Accordingly, the present invention is directed to a thin film transistor substrate and display using the same that substantially obviate one or more of the problems due to limitations and disadvantages of the related art.

An object of the present invention is to provide a thin film transistor substrate for a flat panel display having at least two transistors having different characteristics from each other on the same substrate.

Another object of the present invention is to provide a thin film transistor substrate for a flat panel display having two different types of transistors manufactured with an efficient manufacturing process and reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate includes: a substrate, a first thin film transistor disposed on the substrate, the first thin film transistor including: a polycrystalline semiconductor layer, a first gate electrode on the polycrystalline semiconductor layer, a first source electrode, and a first drain electrode, a second thin film transistor disposed on the substrate, the second thin film transistor including: a second gate electrode, an oxide semiconductor layer on the second gate electrode, a second source electrode, and a second drain electrode, an intermediate insulating layer including a nitride layer and an oxide layer on the nitride layer, the intermediate insulating layer being disposed on the first gate electrode and the second gate electrode and under the oxide semiconductor layer, and an etch-stopper layer disposed on the oxide semiconductor layer.

In another aspect, a thin film transistor substrate includes: a substrate, a first semiconductor layer disposed on the substrate, the first semiconductor layer including a polycrystalline semiconductor material, a gate insulating layer covering the first semiconductor layer, a first gate electrode disposed on the gate insulating layer, the first gate electrode overlapping the first semiconductor layer, a second gate electrode disposed on the gate insulating layer, an intermediate insulating layer covering the first gate electrode and the second gate electrode, the intermediate insulating layer including: a nitride layer, and an oxide layer on the nitride layer, a second semiconductor layer disposed on the intermediate insulating layer, the second semiconductor layer including an oxide semiconductor material, the second semiconductor layer overlapping the second gate electrode, a first source electrode and a first drain electrode disposed on the intermediate insulating layer, an etch-stopper layer covering the second semiconductor layer, and a second source electrode and a second drain electrode disposed on the etch-stopper layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

DETAILED DESCRIPTION

Figure 1:
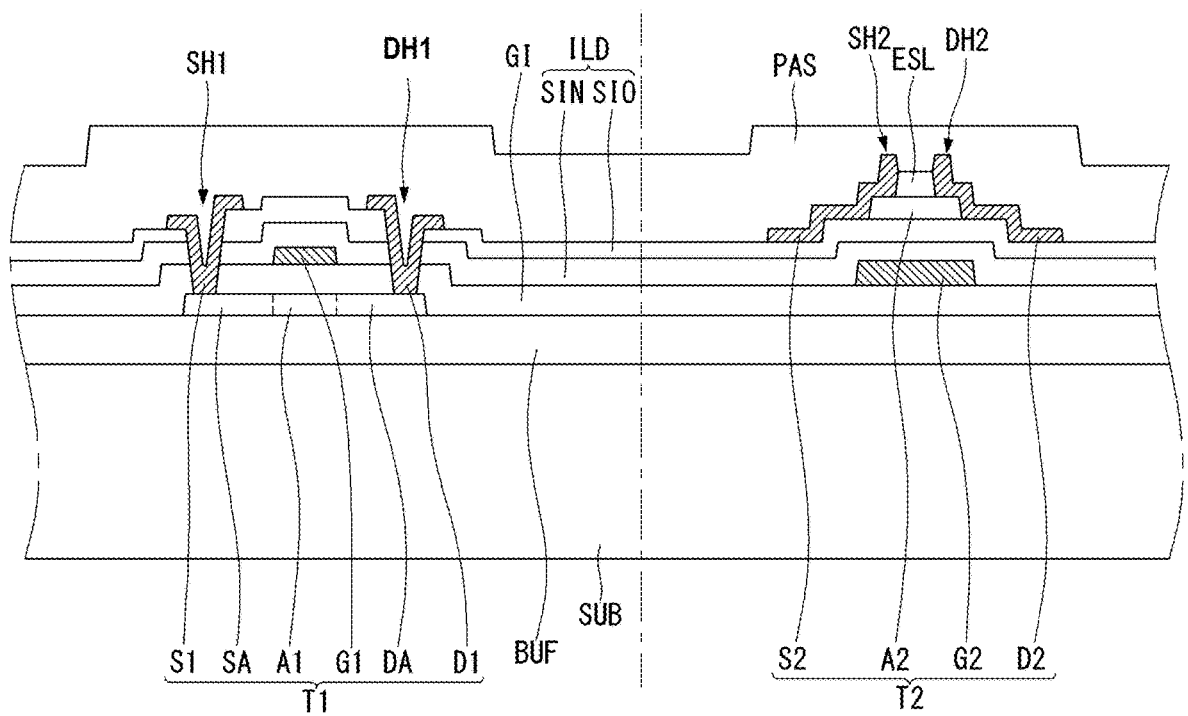
FIG. 1 is a cross sectional view illustrating a structure of a thin film transistor substrate for a flat panel display in which two different type thin film transistors are formed according to a first embodiment of the present disclosure.

Reference will now be made in detail to the preferred embodiments of the present invention, examples of which are illustrated in the accompanying drawings. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names. Hereinafter, the meaning for the term of "on" includes "directly on" and "indirectly on" in all scopes of the specification. Similarly, the meaning for the term of "over" includes "directly over" and "indirectly over" in all scopes of the specification. Further, the meaning for the term of "under" includes "directly under" and "indirectly under" in all scopes of the specification.

The thin film transistor substrate for a flat panel display according to the present disclosure comprises a first thin film transistor disposed in a first area and a second thin film transistor disposed in a second area, on the same substrate. The substrate may include a display area and a non-display area. In the display area, a plurality of pixel area is arrayed in a matrix manner. In one pixel area, the display elements are disposed. In the non-display area surrounding the display area, the driver elements for driving the display elements in the pixel area are disposed.

Here, the first area may be the non-display area, and the second area may be some portions or all portions of the display area. In this case, the first thin film transistor and the second thin film transistor are disposed as they may be apart from each other. Otherwise, the first area and the second area may be included in the display area. Especially, for the case that a plurality of thin film transistor are disposed in one pixel area, the first thin film transistor and the second thin film transistor may be closely disposed.

As the polycrystalline semiconductor material has the characteristics of high mobility (over 100 cm2/Vs) and of low energy consumption power, and it has high reliability, it is proper to apply to the driver IC, such as the gate driver and/or the multiplexer (MUX) for driving the display elements. In addition, it can be applied to the driving thin film transistor disposed in the pixel area of the organic light emitting diode display. As the oxide semiconductor material has low off-current, it is proper to apply to the channel layer of the switching thin film transistor in the pixel area, in which the ON time period is very short but the OFF time period is long. Further, as the off-current is low, the holding time of the pixel voltage may be long, so that it is preferable to apply the display with low frequency drive and/or low power consumption. By disposing these two different type thin film transistors, the present disclosure suggests a thin film transistor substrate having an optimized function and characteristic for the portable and/or wearable displays.

When the semiconductor layer is formed using the polycrystalline semiconductor material, the doping process and high temperature treatment process are used. On the contrary, when the semiconductor layer is formed using the oxide semiconductor material, it is performed under a relatively lower temperature process. Therefore, it is preferable that the polycrystalline semiconductor layer, performed under a more severe heat condition, is first formed, and after that, the oxide semiconductor layer is formed. To do so, in the present disclosure, the first thin film transistor having the polycrystalline semiconductor material may have a top gate structure, and the second thin film transistor having the oxide semiconductor material would have a bottom gate structure.

Further, in view of manufacturing process, when the polycrystalline semiconductor material has a lot of vacancy, the characteristics may be severely degraded. Therefore, a hydrogenation process may be performed in which the vacancies are filled with hydrogen particles. On the other hand, for the oxide semiconductor material, the vacancies may act as the carriers, so it may be desired that the thermal treatment be performed with a small amount of vacancies in the oxide semiconductor material. These processes, the hydrogenation process and the thermal treatment, can be performed by a post-thermal process under a 350~380° C. temperature condition.

For the hydrogenation process, a nitride layer having a lot of hydrogen particles may be provided over the polycrystalline semiconductor material. As the materials used for depositing the nitride layer has a large amount of hydrogen, a lot of hydrogen particles may be included into the deposited nitride layer. By the thermal process, the hydrogen particles can be diffused into the polycrystalline semiconductor material. As the result, the polycrystalline semiconductor layer can be stabilized. During the thermal process, too much of the hydrogen particles should not be diffused into the oxide semiconductor material. Therefore, an oxide layer should be disposed between the nitride layer and the oxide semiconductor material. As a result, the oxide semiconductor layer can be stabilized but may be affected too much by the hydrogen particles.

Hereinafter, for convenience, the first thin film transistor is for the driver IC disposed in the non-display area and the second thin film transistor is for the display element disposed in the pixel area of the display area. However, embodiments are not restricted to this case. For example, in a organic light emitting diode display, the first thin film transistor and the second thin film transistor may be disposed at one pixel area in the display area. Especially, the first thin film transistor having the polycrystalline semiconductor material may be applied for the driving thin film transistor, and the second thin film transistor having the oxide semiconductor material may be applied for the switching thin film transistor.

First Embodiment

FIG. 1 is a cross sectional view illustrating a structure of a thin film transistor substrate for a flat panel display in which two different type thin film transistors are formed according to a first embodiment of the present disclosure. Here, the cross sectional views more clearly and conveniently show the main features of the present disclosure.

With reference to FIG. 1, the thin film transistor substrate for a flat panel display according to the first embodiment comprises a first thin film transistor T1 and a second thin film transistor T2 which are disposed on the same substrate SUB. The first and second thin film transistors T1 and T2 may be far apart from each other, or they may be disposed within a relatively close distance. Otherwise, these two thin film transistors are disposed as being overlapping each other.

On the whole surface of the substrate SUB, a buffer layer BUF is deposited. In some cases, the buffer layer BUF may not be included. Or, the buffer layer BUF may be a plurality of layers. Here, for convenience, a single layer arrangement will be explained. Further, a light shield layer may be included at some areas between the substrate SUB and the buffer layer BUF. The light shield layer may be further disposed to prevent the light from inducing into the semiconductor layer of the thin film transistor disposed thereon.

On the buffer layer BUF, a first semiconductor layer A1 is disposed. The first semiconductor layer A1 includes a channel area of the first thin film transistor T1. The channel area is defined as the overlapped area between the first gate electrode G1 and the first channel layer A1. As the first gate electrode G1 is overlapped with the middle portions of the first semiconductor layer A1, the middle portion of the first semiconductor layer A1 is the channel area. The two areas expanded to both sides of the channel area where the impurities are doped are defined as the source area SA and the drain area DA, respectively.

For the case that the first thin film transistor T1 is for the driver IC, it is preferable that the semiconductor layer has a characteristic for high speed performance with a lower power consumption. For example, P-MOS type or N-MOS type thin film transistor may be used, or C-MOS type may be applied for the first thin film transistor T1. The P-MOS, N-MOS and/or C-MOS type thin film transistor preferably has a polycrystalline semiconductor material, such as polycrystalline silicon (p-Si). Further, the first thin film transistor T1 preferably has a top gate structure.

On the whole surface of the substrate SUB having the first semiconductor layer A1, a gate insulating layer GI is deposited. The gate insulating layer GI may be made of the silicon nitride ($SiN_x$) material or the silicon oxide ($SiO_x$) material. It may be preferable that the gate insulating layer GI has the thickness of 1,000 Å~1,500 Å for ensuring the stability and characteristics of the elements. In the case that the gate insulating layer GI may be made of silicon nitride ($SiN_x$), in the view point of manufacturing process, the gate insulating layer GI includes a lot of hydrogen particles. As these hydrogen particles would be diffused out from the gate insulating layer GI, it is preferable that the gate insulating layer GI is made of silicon oxide material.

The diffusion of the hydrogen particles may cause positive effects on the first semiconductor layer A1 including polycrystalline semiconductor material. However, it may cause negative effects on the second thin film transistor T2 having different material from the first thin film transistor T1. Therefore, when at least two thin film transistors having different characteristics from each other are formed on the same substrate SUB, it is preferable that the gate insulating layer GI would be made of silicon oxide ($SiO_x$), which is less likely to affect the semiconductor material. In some cases, unlike in the first embodiment, the gate insulating layer GI may be deposited as having the thickness of 2,000 Å~4,000 Å. In those cases, when the gate insulating layer GI is made of the nitride silicon ($SiN_x$), much more of the hydrogen particles may be diffused. Considering these cases, it is preferable that the gate insulating layer GI would be the oxide layer, such as silicon oxide ($SiO_x$).

On the gate insulating layer GI, a first gate electrode G1 and a second gate electrode G2 are disposed. The first gate electrode G1 is disposed over the middle portion of the first semiconductor layer A1. The second gate electrode G2 is located where the second thin film transistor T2 is disposed. The first and the second gate electrodes G1 and G2 are formed on the same layer, with the same material, and by using the same mask process. Therefore, the manufacturing process can be simplified.

An intermediate insulating layer ILD is deposited covering the first and the second gate electrodes G1 and G2. The intermediate insulating layer ILD has a multiple layer structure, in which a nitride layer SIN including a silicon nitride ($SiN_x$) and an oxide layer SIO including a silicon oxide ($SiO_x$) are alternatively stacked. Here, for convenience of explanation, the intermediate insulating layer ILD, as described, includes two layers in which the oxide layer SIO is stacked on the nitride layer SIN.

The nitride layer SIN is deposited for performing the hydrogenation process to the first semiconductor layer A1 having the polycrystalline silicon by diffusing the hydrogen particles into the polycrystalline silicon. On the contrary, the oxide layer SIO is for preventing the hydrogen particles of the nitride layer SIN from being diffused too much into the semiconductor material of the second thin film transistor T2.

For example, the hydrogen going out from the nitride layer SIN may diffuse into the first semiconductor layer A1 under the gate insulating layer GI. Therefore, the nitride layer SIN is preferably deposited as close to the gate insulating layer GI as possible. On the contrary, the hydrogen going out from the nitride layer SIN would not diffuse too much into the semiconductor material of the second thin film transistor T2 over the gate insulating layer GI. Therefore, on the nitride layer SIN, the oxide layer SIO should be deposited. Considering the manufacturing process, it is preferable that the intermediate insulating layer ILD has the thickness of 2,000 Å~6,000 Å. Therefore, each thickness of the nitride layer SIN and the oxide layer SIO preferably have a thickness of 1,000 Å~3,000 Å, respectively. Further, in order that much more amount of the hydrogen particles from the nitride layer SIN into the first semiconductor layer A1, but the hydrogen particles may not affect the second semiconductor layer A2, it is preferable that the oxide layer SIO is thicker than the gate insulating layer GI. In addition, as the oxide layer SIO is for controlling the hydrogen diffusion amount, it is preferable that the oxide layer SIO is thicker than the nitride layer SIN.

Especially, on the oxide layer SIO of the intermediate insulating layer ILD, a second semiconductor layer A2 overlapping with the second gate electrode G2 is disposed. The second semiconductor layer A2 includes the channel area of the second thin film transistor T2. For the case that the second thin film transistor T2 is applied for the display element, it is preferable that the second semiconductor layer A2 has characteristics proper to perform the switching element. For example, it is preferable that the second semiconductor layer A2 includes an oxide semiconductor material, such as indium gallium zinc oxide (IGZO), indium gallium oxide (IGO), or indium zinc oxide (IZO). The oxide semiconductor material has a merit for driving the device with relatively low frequency. Due to these characteristics, the pixels may have a long period for holding the pixel voltage, and consequentially, it may be desirable to apply the display with a low frequency drive and/or low power consumption. For the thin film transistor having the oxide semiconductor material, considering the structure in which two different type thin film transistors are formed on the same substrate, it is preferable that the oxide semiconductor thin film transistor has a bottom gate structure for ensuring the stability of the elements.

On the substrate SUB having the second semiconductor layer A2, an etch-stopper layer ESL may be deposited. At the etch-stopper layer ESL, a second source contact hole SH2 exposing one portion of the second semiconductor layer A2 and a second drain contact hole DH2 exposing another portion of the second semiconductor layer A2 may be formed. Further, a first source contact hole SH1 exposing one portion of the first semiconductor layer A1 and a first drain contact hole DH1 exposing another portion of the semiconductor layer A1 may be formed by penetrating the etch-stopper layer ESL, the intermediate layer ILD, and the gate insulating layer.

Otherwise, the etch-stopper layer ESL may be formed as an island shape formed on the middle portions of the second semiconductor layer A2. In such case, both side portions of the second semiconductor layer A2 may be exposed. Therefore, it may be advantageous for the second source contact hole SH2 and the second drain contact hole DH2, for exposing the one portion and the other portion, respectively, to not be formed. Further, as the etch-stopper layer ESL may not be disposed over the first semiconductor layer A1, the first contact hole SH1 and the second drain contact hole DH1 may be formed to penetrate the intermediate insulating layer ILD and the gate insulating layer GI.

The source-drain electrodes may be disposed on the etch-stopper layer ESL. The first source electrode S1 and the first drain electrode D1 may be disposed to face each other with a predetermined distance across the first gate electrode G1. The first source electrode S1 may be connected to one side of the first semiconductor layer A1, e.g., to the source area SA, through the first source contact hole SH1. The first source contact hole SH1 may expose the one side of the first semiconductor layer A1, e.g., the source area SA, by penetrating the etch-stopper layer ESL, the intermediate insulating layer ILD, and the gate insulating layer GI. The first drain electrode D1 may be connected to the other side of the first semiconductor layer A1, e.g., the drain area DA, through the first drain contact hole DH1. The first drain contact hole DH1 may expose the other side of the first semiconductor layer A1, e.g., the drain area DA, by penetrating the etch-stopper layer ESL, the intermediate insulating layer ILD, and the gate insulating layer GI.

In addition, the second source electrode S2 and the second drain electrode D2 may be disposed to face each other with a predetermined distance across the second gate electrode G2. The second source electrode S2 may be connected to one side of the second semiconductor layer A2 through the second source contact hole SH2. The second drain electrode D2 may be connected to the other side of the second semiconductor layer A2 through the second drain contact hole DH2. In an example in which the second source-drain electrodes S2-D2 directly contact the upper surfaces of the second semiconductor layer A2, the channel area may not be precisely defined because the conductivity may be diffused into the channel area from the second source-drain electrode S2-D2 when they are patterned. However, in the present disclosure, the second semiconductor layer A2 may be connected to the second source-drain electrodes S2-D2 through the second source contact holes SH2 and the second drain contact holes DH2, respectively. The channel area can be precisely defined in the second semiconductor layer A2.

On the whole surface of the substrate SUB having the first thin film transistor T1 and the second thin film transistor T2, a passivation layer PAS is deposited. Further, by patterning the passivation layer PAS, contact holes for exposing the first drain electrode D1 and/or the second drain electrode D2 may be included. In addition, on the passivation layer PAS, a pixel electrode (e.g., an anode electrode for the organic light emitting diode display) may be included as connecting to the first drain electrode D1 and/or second drain electrode D2. Here, for convenience, the structure of the thin film transistor showing the main features of the present disclosure will be explained.

As mentioned above, the thin film transistor substrate for the flat panel display according to the first embodiment of the present disclosure suggests the structure in which the first thin film transistor T1 has a polycrystalline semiconductor material and the second thin film transistor T2 has an oxide semiconductor material, on the same one substrate SUB. Especially, the first gate electrode G1 of the first thin film transistor T1 and the second gate electrode G2 of the second thin film transistor T2 are formed on the same layer with the same metal material.

The first semiconductor layer A1 of the first thin film transistor T1 having the polycrystalline semiconductor material is disposed under the first gate electrode G1, but the second semiconductor layer A2 of the second thin film transistor T2 having the oxide semiconductor material is disposed over the second gate electrode G2. The first semiconductor layer A1 which may be manufactured under a relatively higher temperature condition is formed first. After that, the second semiconductor layer A2, which may be manufactured under the relatively lower temperature condition, is formed. As a result, the oxide semiconductor material is not exposed by the high temperature condition, during the whole manufacturing processes. As the first semiconductor layer A1 is formed before forming the first gate electrode G1, the first thin film transistor T1 has a top-gate structure. As the second semiconductor layer A1 is formed after forming the second gate electrode G2, the second thin film transistor T2 a the bottom-gate structure.

Further, in the thermal treatment process for the second semiconductor layer A2 including the oxide semiconductor material, the hydrogenation process for the first semiconductor layer A1 including the polycrystalline semiconductor material can be performed, at the same time. To do so, it is preferable that the intermediate insulating layer ILD includes two stacked layers as disposing an oxide layer SIO over a nitride layer SIN. In the view of manufacturing process, a hydrogenation may be used for diffusing the hydrogen particles into the first semiconductor layer A1. Further, it is advantageous for performing a thermal treatment for stabilizing the second semiconductor layer A2 including the oxide semiconductor material. The hydrogenation process may be performed after depositing the nitride layer SIN on the first semiconductor layer A1, and the thermal treatment may be performed after forming the second semiconductor layer A2. According to the first embodiment of the present disclosure, as the oxide layer SIO is deposited between the nitride layer SIN and the second semiconductor layer A2, the hydrogen particles can be prevented from diffusing too much into the second semiconductor layer A2 including the oxide semiconductor material. Therefore, in this first embodiment of the present disclosure, during the thermal treatment for the oxide semiconductor material, the hydrogenation process may be performed at the same time.

Figure 2:
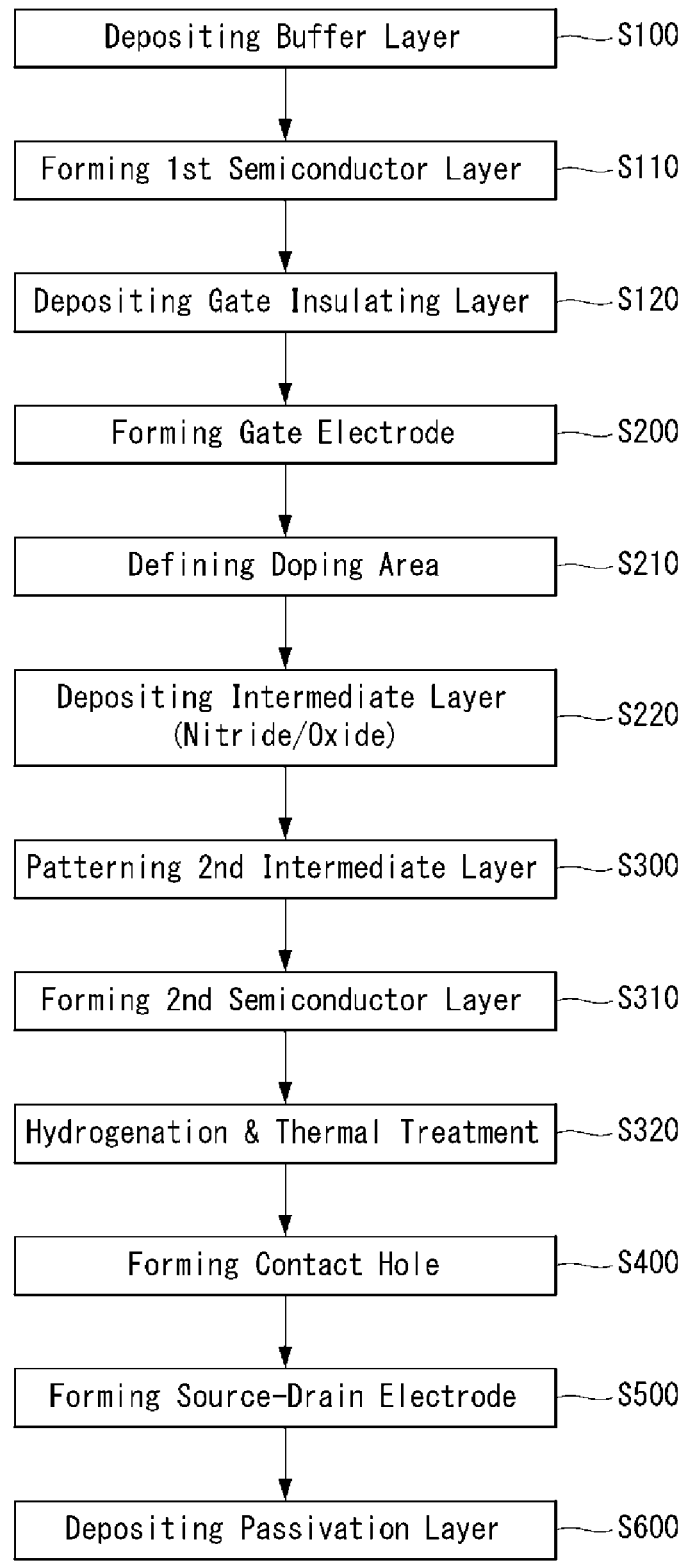
FIG. 2 is a flow chart illustrating a method for manufacturing the thin film transistor substrate for a flat panel display in which two different type thin film transistors are formed according to the first embodiment of the present disclosure.

FIG. 2 is a flow chart illustrating a method for manufacturing a thin film transistor substrate having two different types of thin film transistors according to the first embodiment of the present disclosure.

In operation S100, on a substrate SUB, a buffer layer BUF is deposited. Even though it is not shown in figures, before depositing the buffer layer BUF, a light shield layer may be formed at a desired area.

In operation S110, on the buffer layer BUF, an amorphous silicon (a-Si) material is deposited. Performing the crystallization process, the amorphous silicon layer is converted into the polycrystalline silicon (poly-Si). Using a first mask process, the polycrystalline silicon layer is patterned to form a first semiconductor layer A1.

In operation S120, by depositing an insulating material, such as silicon oxide, on the whole surface of the substrate SUB having the first semiconductor layer A1, a gate insulating layer GI is formed. The gate insulating layer GI preferably includes the silicon oxide. Here, the gate insulating layer GI preferably has a thickness of 1,000 Å~1,500 Å.

In operation S200, on the gate insulating layer GI, a gate metal material is deposited. Using a second mask process, the gate metal layer is patterned to form the gate electrodes. Especially, a first gate electrode G1 for the first thin film transistor T1 and a second gate electrode G2 for the second thin film transistor T2 are formed at the same time. The first gate electrode G1 is disposed as overlapping with the middle portion of the first semiconductor layer A1. The second gate electrode G2 is disposed where the second thin film transistor T2 is formed.

In operation S210, using the first gate electrode G1 as a mask, impurity materials are doped into some portions of the first semiconductor layer A1 so that doping areas including a source area SA and a drain area DA may be defined. The detailed manufacturing process for the doping areas may be little bit different according to the types of thin film transistor (e.g., P MOS type, N-MOS type and/or C-MOS type). For example for the N-MOS type, a high density doping area may be formed first, and then a low density doping area may be formed. Using the photo-resist pattern for the first gate electrode G1 which has a wider size than the first gate electrode G1, the high density doping area can be defined. Removing the photo-resist pattern and using the first gate electrode G1 as a mask, the low density doping (LDD) area can be defined between the high density doping area and the first gate electrode G1. The impurity doping areas are not shown in the figures, for convenience.

In operation S220, on the whole surface of the substrate SUB having the first gate electrode G1 and the second gate electrode G2, an intermediate insulating layer ILD is deposited. Especially, a nitride layer SIN is firstly deposited and then an oxide layer SIO is sequentially deposited thereon. The nitride layer SIN includes a lot of hydrogen particles during the depositing process. Considering the manufacturing process, the total thickness of the intermediate insulating layer ILD may have a thickness of 2,000 Å~6,000 Å. Here, for the nitride layer SIN of which purpose is the diffusion of the hydrogen particles, considering the hydrogenation efficiency, it preferably has a thickness of 1,000 Å~3,000 Å. As the oxide layer SIO is for preventing the hydrogen particle from diffusing too much into the semiconductor layer disposed over the oxide layer SIO, it preferably has the thickness of 1,000 Å~3,000 Å. Considering the hydrogen diffusion efficiency and the element properties, the thicknesses of the oxide layer SIO and the nitride layer SIN may preferably be selected and/or decided. For example, in order to prevent the hydrogen particles from diffusing out too much, the nitride layer SIN is preferably thinner than the oxide layer SIO.

In operation S300, on the intermediate insulating layer ILD, especially on the oxide layer SIO, an oxide semiconductor material is deposited. Further, the oxide semiconductor material is preferably deposited directly on the oxide layer SIO in order that the oxide semiconductor material does not directly contact the nitride layer SIN including the hydrogen particles much. The oxide semiconductor material includes at least one of Indium Gallium Zinc Oxide (IGZO), Indium Gallium Oxide (IGO), and Indium Zinc Oxide (IZO). Using a third mask process, the oxide semiconductor material is patterned to form a second semiconductor layer A2. The second semiconductor layer A2 is disposed as overlapping with the second gate electrode G2.

In operation S310, performing a post-thermal process to the substrate SUB having the second semiconductor layer A2, the hydrogenation for the first semiconductor layer A1 including the polycrystalline silicon and the thermal treatment for the second semiconductor layer A2 including the oxide semiconductor material are performed at the same time. The post-thermal process may be performed under a 350~380° C. temperature condition. At this time, a large amount of the hydrogen particles included in the nitride layer SIN would be diffused into the first semiconductor layer A1. However, the amount of the hydrogen particles diffused into the second semiconductor layer A2 may be restricted and/or controlled by the oxide layer SIO. In some cases, the hydrogenation process for the first semiconductor layer A1 is performed separately from the thermal treatment for the second semiconductor layer A2. In these cases, the hydrogenation process is first performed after operation S220 for depositing the intermediate insulating layer ILD, and then the thermal treatment for the second semiconductor layer A2 is performed by this post-thermal process.

In operation 320, an etch-stopper layer ESL may be deposited using an oxide insulating material such as the silicon oxide ($SiO_x$) material on the whole surface of the substrate SUB having the second semiconductor layer A2. As the etch-stopper layer ESL may be directly stacked on the second semiconductor material A2, the etch-stopper layer ESL may include the oxide insulating material which does not diffuse the hydrogen particles.

In operation S400, using a fourth mask process, the etch-stopper layer ESL may be patterned to form a second source contact hole SH2, exposing one portion of the second semiconductor layer A2, and a second drain contact hole DH2, exposing another portion of the second semiconductor layer A2. At the same time, the etch-stopper layer ESL, the intermediate insulating layer ILD and the gate insulating layer GI may be patterned to form a first source contact hole SH1, exposing the one portion of the first semiconductor layer A1, and a first drain contact hole DH1, exposing the other portion of the first semiconductor layer A1.

The etch-stopper layer ESL may be patterned to cover the middle portions of the second semiconductor layer A2, exposing both side portions and without having the second source contact hole SH2 and the second drain contact hole DH2. In such case, the patterning process for the first source contact hole SH1 and the first drain contact hole DH1 may be performed in sequence after the patterning process for the etch-stopper layer ESL.

Here, the sequential order of the post-thermal treatment process may be changed. For example, operation S400 for forming the contact holes may be performed first, and then operation S310 for performing the post-thermal treatment may be performed later.

In operation S500, a source-drain metal material may be deposited on the etch-stopper layer ESL which may have the first source contact hole SH1, the first drain contact hole DH1, the second source contact hole SH2, and the second drain contact hole DH2. Using a fifth mask process, the source-drain metal material may be patterned to form a first source electrode S1, a first drain electrode D1, a second source electrode S2, and a second drain electrode D2. The first source electrode S1 may connect to the one area of the first semiconductor layer A1, e.g., the source area SA, through the first source contact hole SH1. The first drain electrode D1 may connect to the other area of the first semiconductor layer A1, e.g., the drain area DA, through the first drain contact hole DH1. The second source electrode S2 may connect to the one portion of the second semiconductor layer A2 through the second source contact hole SH2. The second drain electrode D2 may connect to the other portion of the second semiconductor layer A2 through the second drain contact hole DH2.

In the case that the etch-stopper ESL is patterned as covering the middle portions of the second semiconductor layer A2, the second source electrode S2 may contact the upper surfaces of the one side of the etch-stopper layer ESL and the one side of the second semiconductor layer A2. Similarly, the second drain electrode D2 may contact the upper surfaces of the other side of the etch-stopper layer ESL and the other side of the second semiconductor layer A2.

In operation S600, on the whole surface of the substrate SUB having the source-drain electrodes, a passivation layer PAS is deposited. Even though not shown in the figures, the passivation layer PAS may be patterned to form contact holes for exposing some portions of the first and/or second drain electrodes D1 and/or D2.

According to the first embodiment, the intermediate insulating layer ILD may have the double-layered structure in which the oxide layer SIO is stacked on the nitride layer SIN. Otherwise, the intermediate layer ILD may have a triple-layered structure, in which a lower oxide layer (not shown) is further stacked under the nitride layer.

The intermediate layer ILD also acts as a gate insulating layer for the second thin film transistor T2. Therefore, when the intermediate layer ILD is too thick, the gate voltage many not be properly applied to the second semiconductor layer A2. Therefore, the whole thickness of the intermediate layer ILD preferably has a thickness of 2,000 Å~6,000 Å.

By the post-thermal process, the hydrogen particles in the nitride layer SIN would be diffused into the first semiconductor layer A1. In consideration of the diffusion efficiency, it is preferable that the lower oxide layer SIO1 has a thickness of 500 Å~1,500 Å, and the nitride layer SIN has a thickness of 1,000 Å~2,000 Å. As the upper oxide layer SIO2 is for restricting the diffusion of hydrogen into the second semiconductor layer A2, it is preferable that the upper oxide layer SIO2 has the thickness of 1,000 Å~3,000 Å. Especially, as the upper oxide layer SIO2 is for controlling the hydrogen diffusion amount, it is preferable that the upper oxide layer SIO2 is thicker than the nitride layer SIN.

First Application Example

Figure 3:
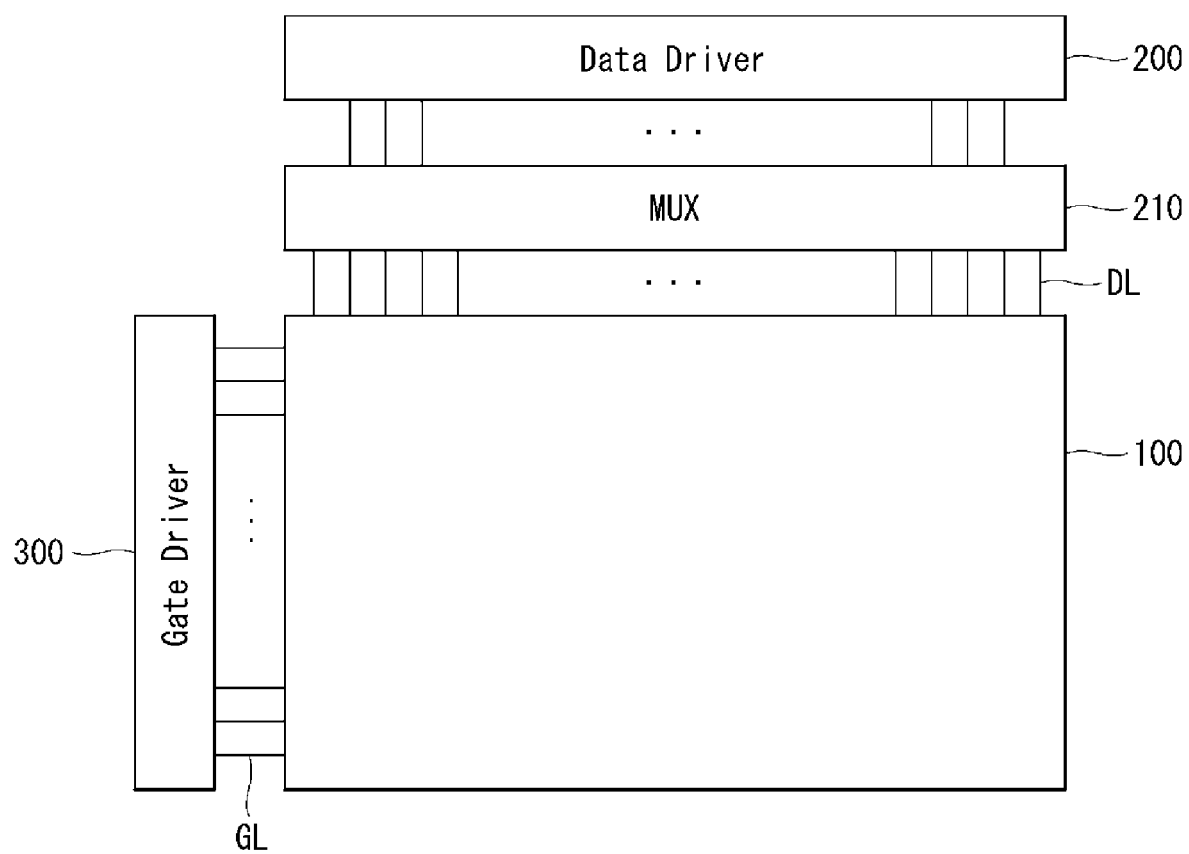
FIG. 3 a block diagram illustrating a structure of a display according to a first application example of the present disclosure.

The thin film transistor substrate having two different type thin film transistors on the same substrate, above explained, can be applied to various type display including the flat panel display, the flexible display and/or the curved display. By forming the different two types of thin film transistors on the same substrate, various advantages can be achieved. FIG. 3 is a block diagram illustrating a structure of the display according to a first application example of the present disclosure. With reference to FIG. 3, advanced features and merits expected from the thin film transistor substrate according to a first application example of the present disclosure will be explained.

The first and the second transistors T1 and T2 would be formed in each pixel of the display panel 100 for switching the data voltage applied to the pixel or for driving the pixel. In the case of an organic light emitting diode display, the second thin film transistor T2 may be a switch element for the pixel, and the first thin film transistor T1 may be a driver element. In the interim, by combining the first and the second thin film transistors T1 and T2, they may be applied to one switch element or one driver element.

For a mobile device or a wearable device, in order to reduce the power consumption, the lower speed driving method using a low frame rate is adopted. In this case, the frame frequency may be lowered for still image and/or images having a slower update interval. Here, when using the lower frame rate, at every time for changing the data voltage, the brightness of the display may be flashed. In some cases, as the discharging time interval is elongated, the brightness may be flickered at every data update period. By applying the first and the second thin film transistors T1 and T2 according to the present disclosure, the flicker problem at lower speed driving method can be prevented.

In the lower speed driving method, as the data update period is elongated, the leaked current amount of the switching thin film transistor may be increased. The leaked current of the switching thin film transistor may cause a voltage drop down of the storage capacitance and a drop down of the voltage between gate and source. The second thin film transistor having the oxide semiconductor material can be applied to the switch thin film transistor of the organic light emitting diode display. Because the thin film transistor including the oxide semiconductor material has lower off-current characteristics, the voltage drop down of the storage capacitance and/or of the gate electrode of the driving thin film transistor is prevented. The flicker phenomenon does not occur when using the lower speed driving method.

As polycrystalline silicon has the characteristics of high mobility, by applying the first thin film transistor to the driving thin film transistor of the organic light emitting diode display, the current amount supplied to the organic light emitting diode can be enlarged. Therefore, by applying the second thin film transistor T2 to the switching thin film transistor and the first thin film transistor T1 to the driving thin film transistor, the organic light emitting diode display can achieve lower power consumption and better video quality.

As the thin film transistor substrate according to the present disclosure has excellent video quality without flickers even though the lower speed driving method is applied, it has a merit of being very suitable for applying to the mobile display or the wearable display. For the example of wearable wrist watch, the video data may be updated at every one second for reducing the power consumption. In that case, the frame frequency is 1 Hz. Using the arrangement of the present disclosure, excellent video quality without flickering can be achieved even though the video data is driven with lower frequency, such as 1 Hz or less. Further, for the mobile display or the wearable display, the frame rate for the still image can be remarkably lowered, so that the power consumption can be saved without any degradation of the video quality. As the result, the video quality of the mobile display and/or wearable display, and the life time of the battery can be elongated. In addition, the present disclosure can be applied to the electric book device (or "E-Book") of which the data update period is very long, without any degradation of the video quality.

At least one of the first and the second thin film transistors T1 and T2 may be embedded into a driver IC, for example shown in FIG. 3, e.g., any one of the data driver IC 200, the multiplexer (MUX) 210, and the gate driver IC 300, for forming the driver IC. This driver IC writes and/or applies the data voltage to the pixel. In another case, any one of the first and the second thin film transistors T1 and T2 is disposed within the pixel, and the other is disposed in the driver IC. The data driver IC 200 converts the input video data into the voltage values and output the voltage values. The multiplexer 210 may reduce the number of the output channel of the data driver 200, by distributing the data voltages from the data driver 200 to the data lines DL by time-sharing or time-division method. The gate driver IC 300 outputs the scan signal (or "gate signal") to the gate line GL synchronized to the data voltage for sequentially selecting the pixel line where the data voltage is applied. In order to reduce the output channel number of the gate driver IC 300, other multiplexers not shown in the figures may be further included between the gate driver IC 300 and the gate line GL. The multiplexer 210 and the gate driver IC 300 may be formed on the same thin film transistor substrate within the pixel array, as shown in FIG. 3. The multiplexer 210 and the gate driver IC 300 may be disposed within the non-display area NA and the pixel array may be disposed within the display area AA, as shown in FIG. 3.

The thin film transistor substrate according to the present disclosure may be applied to any type of active type display using an active matrix thin film transistor substrate, such as the liquid crystal display, the organic light emitting diode display, and/or the electrophoresis display device. Hereinafter, more application examples for the display using the thin film transistor substrate according to the present disclosure will be explained.

Second Application Example

Figure 4:
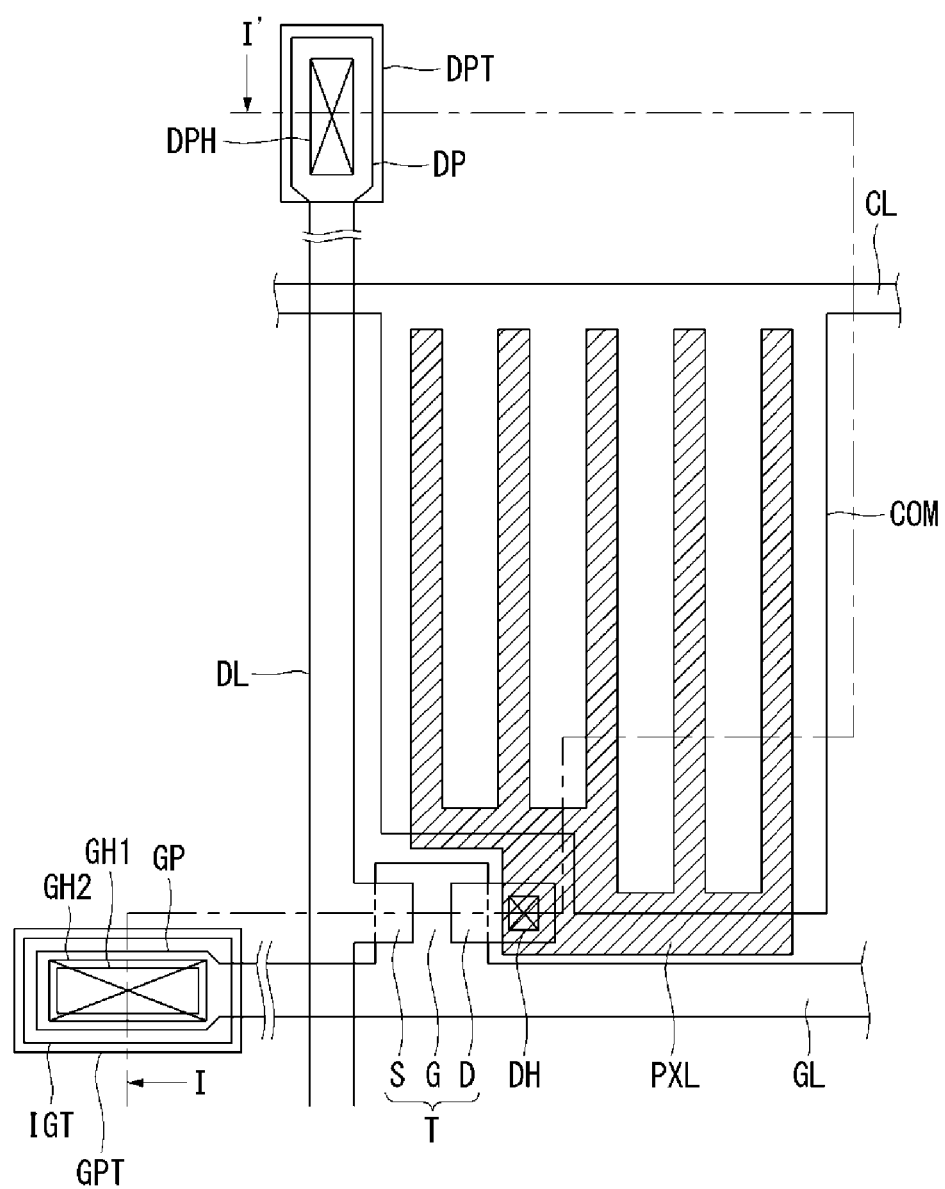
FIG. 4 is a plane view illustrating a thin film transistor substrate having an oxide semiconductor layer included in a fringe field type liquid crystal display according to a second application example of the present disclosure.
Figure 5:
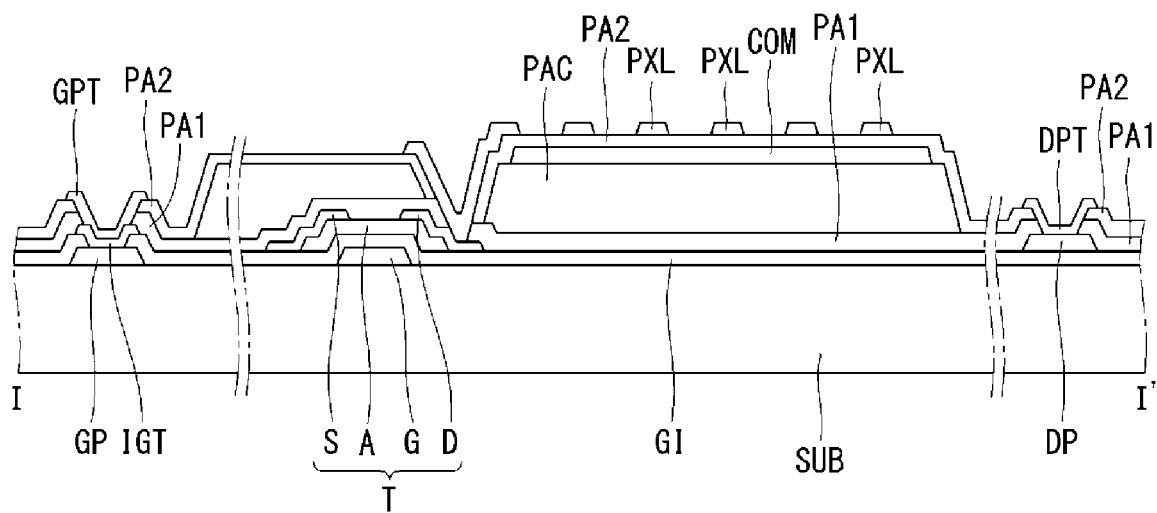
FIG. 5 is a cross-sectional view illustrating the structure of the thin film transistor substrate of FIG. 4 by cutting along the line I-I' according to the second application example of the present disclosure.

FIG. 4 is a plane view illustrating a thin film transistor substrate having an oxide semiconductor layer included in a fringe field type liquid crystal display according to a second application example of the present disclosure. FIG. 5 is a cross-sectional view illustrating the structure of the thin film transistor substrate of FIG. 4 by cutting along the line I-I' according to the second application example of the present disclosure.

The thin film transistor substrate having a metal oxide semiconductor layer shown in FIGS. 4 and 5 comprises a gate line GL and a data line DL crossing each other with a gate insulating layer GI therebetween on a lower substrate SUB, and a thin film transistor T formed at each crossing portion. By the crossing structure of the gate line GL and the data line DL, a pixel area is defined.

The thin film transistor T comprises a gate electrode G branched (or "extruded") from the gate line GL, a source electrode S branched from the data line DL, a drain electrode D facing the source electrode S, and a semiconductor layer A overlapping with the gate electrode G on the gate insulating layer GI for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 there-between, to form a fringe electric field. The common electrode COM is connected to the common line CL disposed in parallel with the gate line GL. The common electrode COM is supplied with a reference voltage (or "common voltage") via the common line CL. For other cases, the common electrode COM has the one sheet electrode shape which covers the whole surface of the substrate SUB except the drain contact hole DH portions. That is, covering over the data line DL, the common electrode COM can work as a shielding means for the data line DL.

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. Due to the parasitic capacitance, the video quality of the display may be degraded. Therefore, it is preferable that the common electrode COM is disposed at the lower layer and the pixel electrode PXL is disposed at the topmost layer.

In other words, on the first passivation layer PA1 covering the data line DL and the thin film transistor T, a planarization layer PAC is stacked thereon by thickly depositing an organic material having a low permittivity. Then, the common electrode COM is formed. And then, after depositing the second passivation layer PA2 to cover the common electrode COM, the pixel electrode PXL overlapping with the common electrode is formed on the second passivation layer PA2. In this structure, the pixel electrode PXL is far from the data line DL by the first passivation layer PA1, the planarization layer PAC and the second passivation layer PA2, so that it is possible to reduce the parasitic capacitance between the data line DL and the pixel electrode PXL. In other case, the pixel electrode PXL may be disposed at the lower layer and the common electrode COM is disposed at the topmost layer.

The common electrode COM may have a rectangular shape corresponding to the pixel area. The pixel electrode PXL may have the shape of a plurality of segments. Especially, the pixel electrode PXL is vertically overlapped with the common electrode COM with the second passivation layer PA2 there-between. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed to represent desired gray scale.

In FIGS. 4 and 5 for explaining the second application example of the present disclosure, in convenience, the thin film transistor T of the liquid crystal display is shown briefly. The first and/or the second thin film transistors T1 and/or T2 explained from the first to second embodiments of the present disclosure can be applied to this thin film transistor. In one example, for a low speed driving, the second thin film transistor T2 having the oxide semiconductor material can be applied to the thin film transistor T. In another example, for low power consumption, the first thin film transistor T1 having the polycrystalline semiconductor material may be applied to the thin film transistor T. In still another example, the thin film transistor T may be formed as including the first and the second thin film transistors T1 and T2 and they are connected so that their performance and characteristics can compensate each other.

Third Application Example

Figure 6:
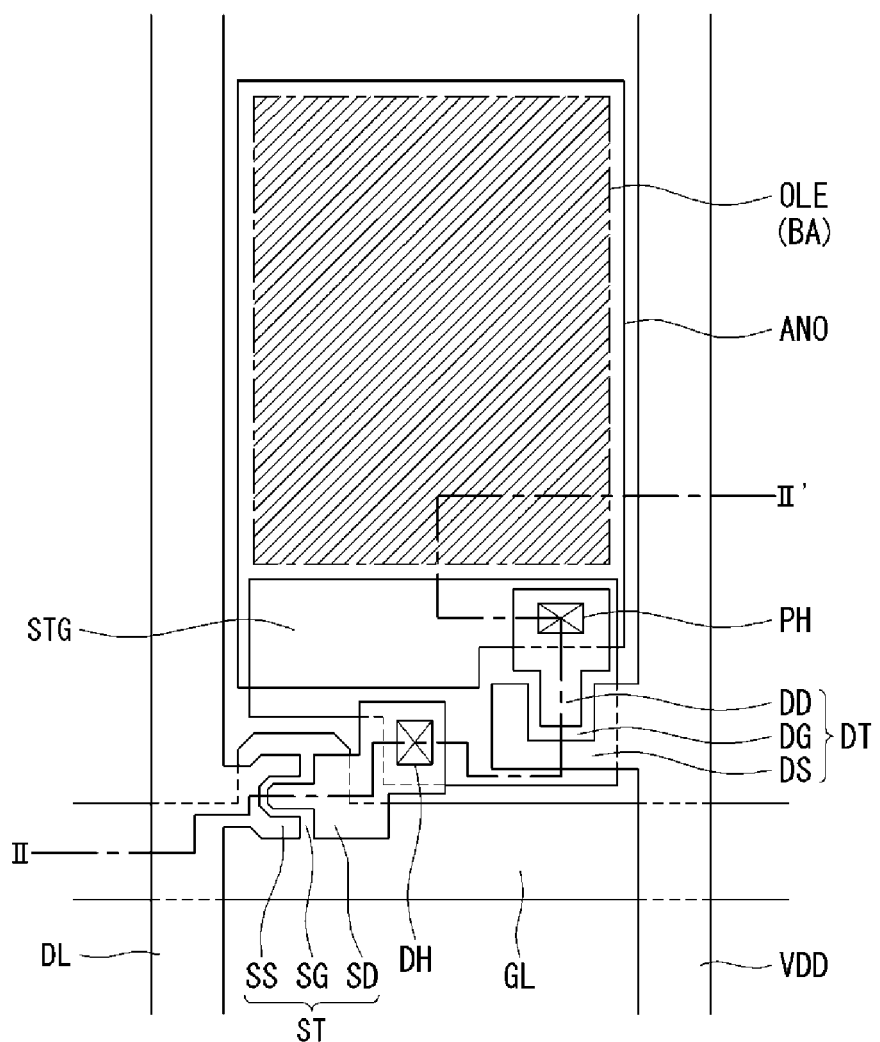
FIG. 6 is a plane view illustrating the structure of one pixel for the active matrix type organic light emitting diode display having active switching elements, such as thin film transistors, according to a third application embodiment of the present disclosure.
Figure 7:
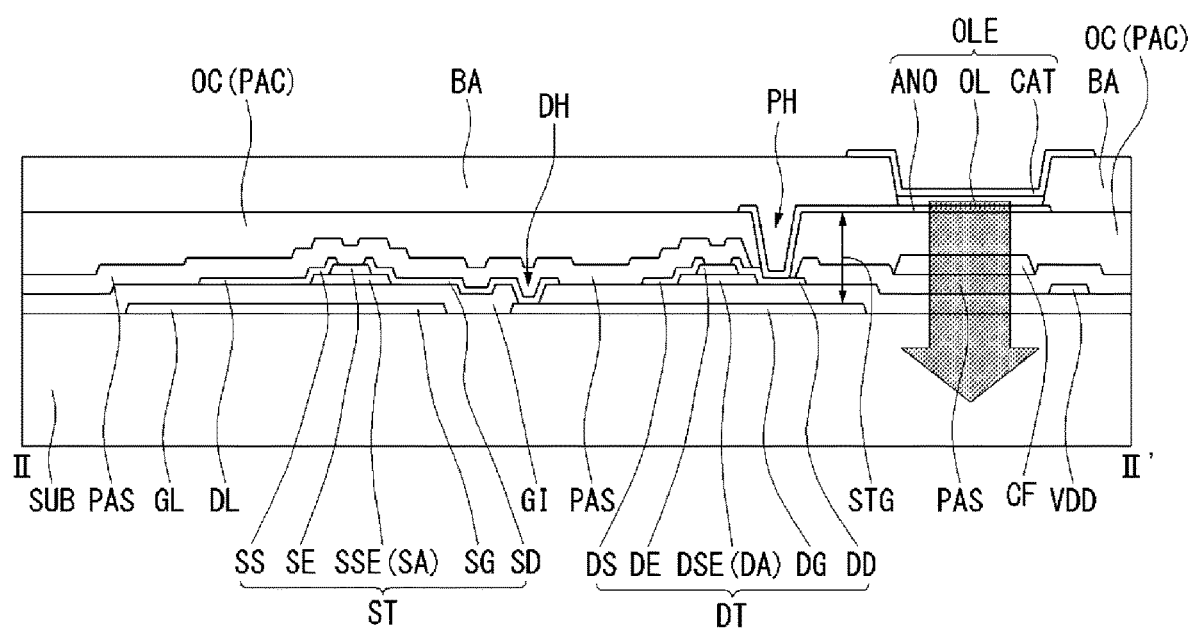
FIG. 7 is a cross sectional view illustrating the structure of the organic light emitting diode display along to the cutting line II-IF in FIG. 6 according to a third application embodiment of the present disclosure.

FIG. 6 is a plane view illustrating the structure of one pixel for the active matrix type organic light emitting diode display having the active switching elements such as the thin film transistors according to a third application example of the present disclosure. FIG. 7 is a cross sectional view illustrating the structure of the organic light emitting diode display along to the cutting line of II-II' in FIG. 6 according to the third application example of the present disclosure.

With reference to FIGS. 6 and 7, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL are crossing each other, on a substrate SUB. Supplying the data voltage from the data line DL to the gate electrode DG of the driving thin film transistor DT and to the storage capacitance STG replying the scan signal, the switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. Controlling the amount of the current applied to the organic light emitting diode OLE of the pixel according to the gate voltage, the driving thin film transistor DT acts for driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line VSS.

With more detailed reference to FIG. 7, on the substrate SUB of the active matrix organic light emitting diode display, the gate electrodes SG and DG of the switching thin film transistor ST and the driving thin film transistor DT, respectively are disposed. On the gate electrodes SG and DG, the gate insulator GI is deposited. On the gate insulator GI overlapping with the gate electrodes SG and DG, the semiconductor layers SA and DA are disposed, respectively. On the semiconductor layer SA and DA, the source electrodes SS and DS and the drain electrodes SD and DD facing and separated from each other, respectively, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is disposed. It is preferable for the color filter CF to have a large area as possible. For example, it is preferable to overlap with some portions of the data line DL, the driving current line VDD and/or the gate line GL. The upper surface of the substrate having these thin film transistors ST and DT and color filters CF is not in an even and/or smooth condition, but in an uneven and/or rugged condition having many steps. In order that the organic light emitting diode display has good luminescent quality over the whole display area, the organic light emitting layer OL should have an even or smooth surface. So, to make the upper surface in a planar and even condition, the planar layer PAC or the overcoat layer OC is deposited on the whole surface of the substrate SUB.

Then, on the overcoat layer OC, the anode electrode ANO of the organic light emitting diode OLED is disposed. Here, the anode electrode ANO is connected to the drain electrode DD of the driving thin film transistor DT through the pixel contact hole PH penetrating the overcoat layer OC and the passivation layer PAS.

On the substrate SUB having the anode electrode ANO, a bank (or "bank pattern") BA is disposed over the area having the switching thin film transistor ST, the driving thin film transistor DT and the various lines DL, GL, and VDD, for defining the pixel area. The exposed portion of the anode electrode ANO by the bank BA is the light emitting area. On the anode electrode ANO exposed from the bank BA, the organic light emitting layer OL is deposited. On the organic light emitting layer OL, the cathode electrode ACT is deposited. For the case that the organic light emitting layer OL has a material emitting the white light, each pixel can represent various colors by the color filter CF disposed under the anode electrode ANO. The organic light emitting diode display as shown in FIG. 7 is the bottom emission type display in which the visible light is radiated to the bottom direction of the display substrate.

Between the gate electrode DG of the driving thin film transistor DT and the anode electrode ANO, a storage capacitance STG may be formed. By connected to the driving thin film transistor DT, the storage capacitance STG keeps the voltage supplied to the gate electrode DG of the driving thin film transistor DT from the switching thin film transistor ST in stable condition.

Using the thin film transistor substrate like the above explanations, an active type flat panel display having good properties can be acquired. Especially, to ensure excellent driving properties, it is preferable that the active layer of the thin film transistor would include a metal oxide semiconductor material.

The metal oxide semiconductor material may be degraded when it is working exposed by the light for a long time. Therefore, it is preferable that the thin film transistor having a metal oxide semiconductor material has a structure for blocking light from outside of the upper portion and/or the lower portion of the thin film transistor. For example, for the above mentioned thin film transistor substrates, it is preferable that the thin film transistor would be formed in the bottom gate structure. That is, the light induced from the outside of the substrate, especially from the lower side of the substrate facing the observer, can be blocked by the gate electrode G including an opaque metal material.

The thin film transistor substrate for the flat panel display has a plurality of pixel area disposed in a matrix manner. Further, each pixel area includes at least one thin film transistor. That is, over the whole substrate, a plurality of thin film transistor is disposed. The plurality of pixel area and the plurality of thin film transistor are used for the same purpose and they should have the same quality and characteristics, so that they have the same structure.

However, in some cases, the thin film transistors may be formed as having different characteristics from each other. For the example of the organic light emitting diode display, in one pixel area, at least one switching thin film transistor ST and at least one driving thin film transistor DT are disposed. As the purposes of the switching thin film transistor ST and the driving thin film transistor DT are different from each other, the characteristics of the two are different from each other as well. To do so, the switch thin film transistor ST and the driving thin film transistor DT may have the same structure and the same semiconductor material, but the channel layers of them have different sizes for optimizing their characteristics. Otherwise, a compensating thin film transistor may further be included for supporting any specific functions or properties of any thin film transistor.

In FIGS. 6 and 7, the switching thin film transistor ST and the driving thin film transistor DT of the organic light emitting diode display of the third application example are shown. The first and/or the second thin film transistors T1 and/or T2 explained from the first to second embodiments of the present disclosure can be applied to this thin film transistor. For example, the second thin film transistor T2 having the oxide semiconductor material can be applied for the switching thin film transistor ST. The first thin film transistor T1 having the polycrystalline semiconductor material may be applied for the driving thin film transistor DT. Therefore, by including the first and the second thin film transistors T1 and T2 on one substrate, their performance and characteristics can compensate each other.

Fourth Application Example

For still another example, a driver element (or "driver IC") may be formed in the non-display area of the same thin film transistor substrate for the flat panel display. Hereinafter, with reference to FIGS. 8 and 9, a thin film transistor substrate having the driver IC on the same substrate will be explained.

Figure 8:
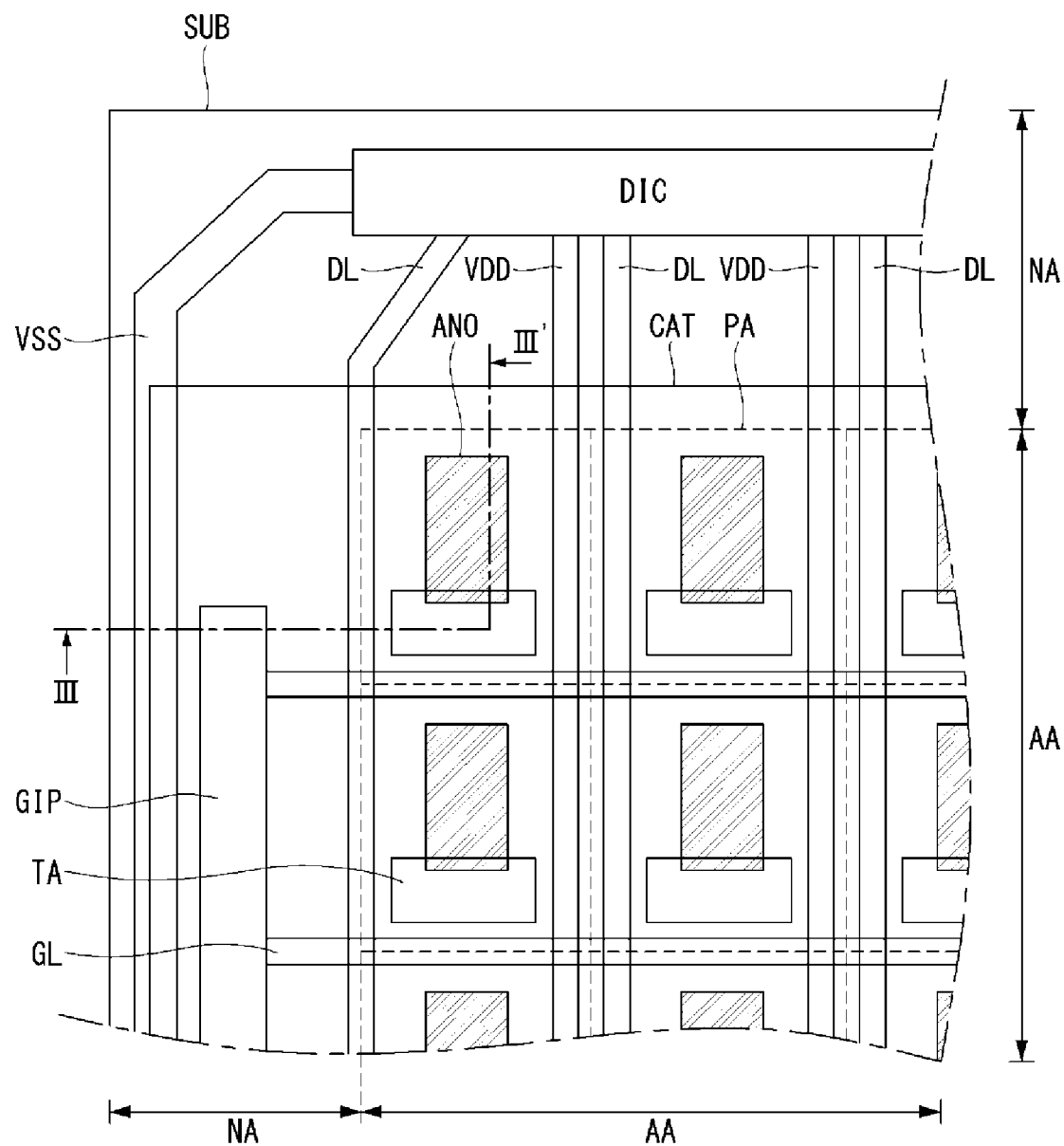
FIG. 8 is an enlarged plane view illustrating a structure of an organic light emitting diode display according to a fourth application embodiment of the present disclosure.
Figure 9:
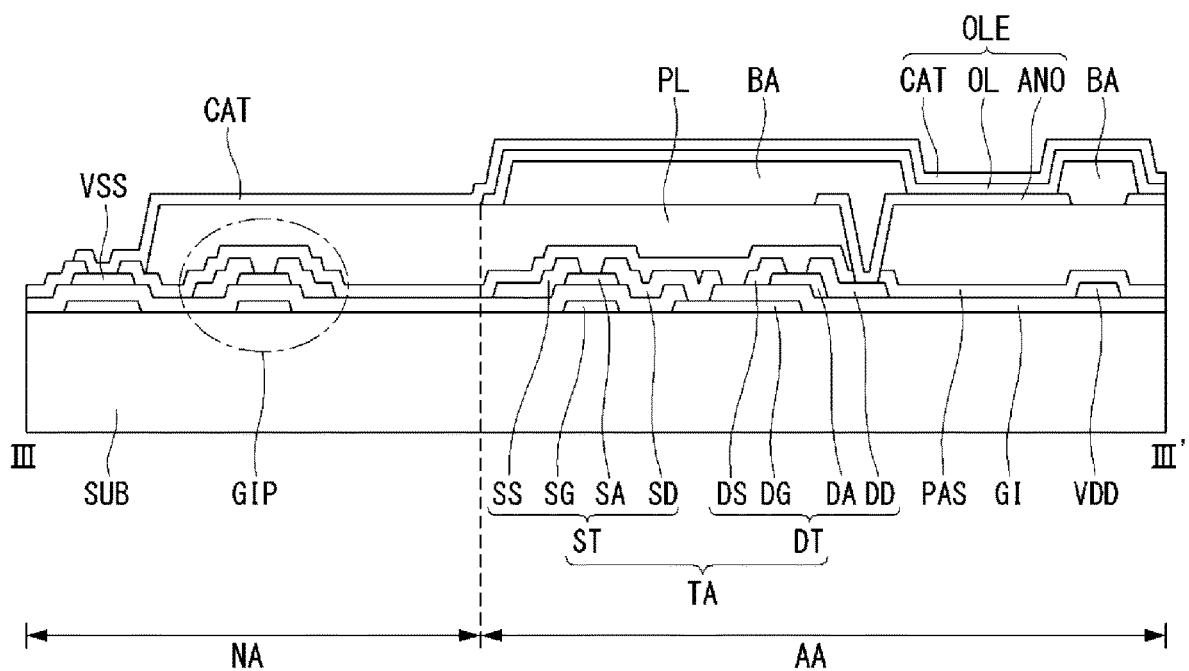
FIG. 9 is a cross sectional view illustrating a structure of the organic light emitting diode display along the cutting line III-III' in FIG. 8 according to a fourth application embodiment of the present disclosure.

FIG. 8 is an enlarged plane view illustrating a structure of an organic light emitting diode display according to a fourth application example of the present disclosure. FIG. 9 is a cross sectional view illustrating a structure of the organic light emitting diode display along to the cutting line of III-III' in FIG. 8 according to a fourth application example of the present disclosure. Here, as the explanation for the thin film transistor substrate having a driver therein is similar, a detailed explanation about the thin film transistor substrate and the organic light emitting diode will be omitted.

The plane structure of the organic light emitting diode display according to the fourth application example will be explained in detail with reference to FIG. 8. An organic light emitting diode display according to the fourth application example comprises a substrate SUB including a display area AA for representing the video information and a non-display area NA having various elements for driving the elements in the display area AA. In the display area AA, a plurality of pixel areas PA disposed in a matrix manner are defined. In FIG. 8, the pixel area PA is illustrated as the dotted line.

For example, the pixel areas PA can be defined as an N (row)×M (column) matrix. However, the disposed pattern is not restricted this manner, but has various types. Each of the pixel area PA has the same size or a different size. With one unit pixel having three sub pixels including red (R), green (G), and blue (B) sub pixels, the unit pixels are regularly disposed. Explaining with a simple structure, the pixel area PA can be defined by the crossing structure of a plurality of gate lines GL running in a horizontal direction and a plurality of data lines DL running in a vertical direction.

In the non-display area NA defined as the peripheral area surrounding the pixel area PA, a data driving integrated circuit DIC for supplying the video data to the data line DL and a gate driving integrated circuit GIP for supplying the scan signal to the gate line GL are disposed. For a case of a higher resolution display panel than a VGA panel in which more data lines DL and more driving current lines VDD may be used, the data driving integrated circuit DIC may be externally installed from the substrate SUB, and data contact pads may be disposed on the substrate SUB instead of the data driving integrated circuit DIC.

In order to simply show the structure of the display, the gate driving integrated circuit GIP is formed on one side portion of the substrate SUB directly. The ground line VSS for supplying the ground voltage may be disposed at the outermost side of the substrate SUB. The ground line VSS is disposed to receive the ground voltage from an external device located out of the substrate SUB, and to supply the ground voltage to the data driving integrated circuit DIC and the gate driving integrated circuit GIP. For example, the ground line VSS may be linked to the data driving integrated circuit DIC disposed at the upper side of the substrate SUB and to the gate driving integrated circuit GIP disposed at the right side and/or left side of the substrate SUB to surround the substrate SUB.

At each pixel area PA, the main elements such as an organic light emitting diode and thin film transistors for driving the organic light emitting diode are disposed. The thin film transistor is disposed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping the anode electrode ANO.

The anode electrode ANO has a shape as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL to cover a whole surface of the display area AA having the pixel areas PA.

The cathode electrode CAT may go over the gate driving integrated circuit GIP and contact the ground line VSS disposed at the outer side. So, the ground voltage can be supplied to the cathode electrode CAT through the ground line VSS. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

The cross-sectional structure of the organic light emitting diode display according to the fourth application example will be explained in detail with reference to FIG. 9. On the substrate SUB, a non-display area NA and a display area AA are defined. The non-display area NA includes an area where the gate driving integrated circuit GIP and the ground line VSS are disposed. The display area AA includes an area where a switching thin film transistor ST, a driving thin film transistor DT and an organic light emitting diode OLE are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS, and a drain electrode DD.

On the thin film transistors ST and DT, a passivation layer PAS and a planar layer PL are sequentially deposited. On the planar layer PL, an anode electrode ANO having an isolation shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. On the exposed anode electrode ANO, an organic light emission layer OL is deposited. Depositing a transparent conductive material on the bank BA and the organic light emission layer OL, the cathode electrode CAT is stacked. The organic light emitting diode OLED including the anode electrode ANO, the organic light emission layer OL, and the cathode electrode CAT is disposed.

In the case that the organic light emission layer OL may generate the white lights, color filters CF may be further included for representing full color video information. In that case, the organic light emission layer OL would be preferably deposited as covering the whole surface of the display area AA.

The cathode electrode CAT is expanded over the gate driving integrated circuit GIP so that it may cover the display area AA and the non-display area NA and contact the ground line VSS disposed at the outer circumstance of the substrate SUB. As a result, the ground (or, reference) voltage can be supplied to the cathode electrode CAT via the ground line VSS.

In addition, the ground line VSS may be formed at the same layer and made of the same material with the gate electrodes SG and DG. In that case, the cathode electrode CAT can be connected to the ground line VSS through the contact hole penetrating the passivation layer PAS and the gate insulating layer GI over the ground line VSS. Otherwise, the ground line VSS may be formed at the same layer and made of the same material with the source-drain electrodes SS-SD and DS-DD. In this case, the cathode electrode CAT can be connected to the ground line VSS through the contact hole penetrating the passivation layer PAS over the ground line VSS.

In FIGS. 8 and 9, the switching thin film transistor ST and the driving thin film transistor DT of the organic light emitting diode display of the fourth application example are shown. The first and/or the second thin film transistors T1 and/or T2, explained in the first to second embodiments of the present disclosure, can be applied to these thin film transistors. For example, the second thin film transistor T2 having the oxide semiconductor material can be applied for the switching thin film transistor ST. The first thin film transistor T1 having the polycrystalline semiconductor material may be applied for the driving thin film transistor DT. Further, for the gate driver IC GIP, the first thin film transistor T1 having the polycrystalline semiconductor material may be applied. For example, for the gate driver IC GIP, the C-MOS type thin film transistor may include P-MOS type and N-MOS type thin film transistors.

A thin film transistor substrate for a flat panel display and a display using the same according to the present disclosure comprises two different types of thin film transistors on the same substrate so that the disadvantage of any one type of thin film transistor can be compensated by the other type of thin film transistor. For example, with a thin film transistor having low frequency driving characteristics, the display can have the low power consumption property, and the display can be applied to the portable and/or wearable appliances.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. A display device, comprising:
    a substrate;
    a first thin film transistor disposed on the substrate and including a polycrystalline semiconductor layer, a first gate electrode on the polycrystalline semiconductor layer, a first source electrode, and a first drain electrode;
    a second thin film transistor disposed on the substrate and including a second gate electrode, an oxide semiconductor layer on the second gate electrode, a second source electrode, and a second drain electrode;
    a gate insulating layer made of a silicon oxide material and covering the polycrystalline semiconductor layer;
    an intermediate insulating layer consisting of a nitride layer including a silicon nitride and an oxide layer including a silicon oxide directly on the nitride layer, the intermediate insulating layer being disposed directly on the first gate electrode and the second gate electrode, and said intermediate insulating layer being directly under the oxide semiconductor layer;

an etch-stopper layer disposed on the oxide semiconductor layer; and a driver, wherein the first gate electrode is disposed directly on the gate insulating layer and overlapping with the polycrystalline semiconductor layer, wherein the second gate electrode is disposed directly on the gate insulating layer, wherein the first source electrode is disposed on the oxide layer, and connected to one portion of the polycrystalline semiconductor layer through a first source contact hole penetrating the intermediate insulating layer and the gate insulating layer, wherein the first drain electrode is disposed on the oxide layer, and connected to another portion of the polycrystalline semiconductor layer through a first drain contact hole penetrating the intermediate insulating layer and the gate insulating layer, wherein the second source electrode is disposed on the nitride layer and connected to one portion of the oxide semiconductor layer, wherein the second drain electrode is disposed on the nitride layer and connected to another portion of the oxide semiconductor layer, wherein the second thin film transistor is disposed in a pixel, wherein the first thin film transistor is disposed at the driver, wherein the driver includes:
  a data driver configured to output a data voltage;
  a multiplexer configured to distribute the data voltage from the data driver to a data line; and
  a gate driver configured to output a scan pulse to a gate line, wherein the first thin film transistor is disposed at the multiplexer, wherein the oxide layer of the intermediate insulating layer is thicker than the nitride layer of the intermediate insulating layer and thicker than the gate insulating layer, and wherein the nitride layer of the intermediate insulating layer is disposed closer to the polycrystalline semiconductor layer than to the oxide semiconductor layer.

2. The display device of claim 1, wherein the second thin film transistor is a switching element for selecting the pixel.

3. The display device of claim 1, wherein each of the nitride layer and the oxide layer of the intermediate insulating layer has a thickness of 1,000 Å~3,000 Å.

4. The display device of claim 1, wherein a thickness of the gate insulating layer is substantially the same below the first gate electrode as below the second gate electrode.

5. The display device of claim 1, further comprising a passivation layer disposed on the etch-stopper layer, the first source electrode, the first drain electrode, the second source electrode, and the second drain electrode.

6. The display device of claim 1, wherein the etch-stopper layer is disposed on a middle portion of the oxide semiconductor layer in an island shape, thereby exposing side portions of the oxide semiconductor layer.

7. The display device of claim 6, wherein the second source electrode and the second drain electrode respectively directly contact the exposed side portions of the oxide semiconductor layer.

8. The display device of claim 1, further comprising a buffer layer on the substrate,
  wherein the polycrystalline semiconductor layer and the gate insulating layer are directly on the buffer layer.

* * * * *